United States Patent
Rahardjo et al.

(10) Patent No.: US 9,823,328 B2
(45) Date of Patent: Nov. 21, 2017

(54) SYSTEMS AND METHODS OF CURRENT SENSE CALIBRATION FOR VOLTAGE REGULATOR CIRCUITS

(71) Applicant: Dell Products L.P., Round Rock, TX (US)

(72) Inventors: Johan Rahardjo, Austin, TX (US); John J. Breen, Harker Heights, TX (US); Abey K. Mathew, Georgetown, TX (US)

(73) Assignee: Dell Products LP, Round Rock, TX (US)

( * ) Notice: Subject to any disclaimer, the term of this patent is extended or adjusted under 35 U.S.C. 154(b) by 647 days.

(21) Appl. No.: 14/449,949

(22) Filed: Aug. 1, 2014

(65) Prior Publication Data

US 2016/0033611 A1 Feb. 4, 2016

(51) Int. Cl.
G01R 35/00 (2006.01)
G01R 19/00 (2006.01)

(52) U.S. Cl.
CPC ........ G01R 35/005 (2013.01); *G01R 19/0092* (2013.01)

(58) Field of Classification Search
CPC .................................................. G01R 35/005
USPC ........................................................ 702/104
See application file for complete search history.

(56) References Cited

U.S. PATENT DOCUMENTS

| 6,346,801 | B1 | 2/2002 | Zafarana et al. |
| 7,265,601 | B2 | 9/2007 | Ahmad |
| 7,673,157 | B2 | 3/2010 | Chapuis et al. |
| 7,999,520 | B2 | 8/2011 | Luo et al. |
| 8,125,200 | B2 | 2/2012 | Tsai et al. |
| 8,570,006 | B2 | 10/2013 | Moussaoui et al. |
| 8,957,658 | B2 | 2/2015 | Nakamura et al. |
| 9,000,786 | B2 * | 4/2015 | Luo ........................ G06F 1/26 324/750.01 |
| 9,444,338 | B1 * | 9/2016 | Pastorina ................. G05F 1/10 |
| 2005/0073288 | A1 | 4/2005 | Harris |
| 2006/0190532 | A1 | 8/2006 | Chadalavada |
| 2006/0212143 | A1 | 9/2006 | Nguyen et al. |
| 2009/0153110 | A1 | 6/2009 | Huang |
| 2010/0225287 | A1 | 9/2010 | Schultz |
| 2010/0277151 | A1 | 11/2010 | Tsai et al. |
| 2012/0275610 | A1 | 11/2012 | Lambert et al. |
| 2012/0324246 | A1 | 12/2012 | Rahardjo et al. |
| 2013/0057239 | A1 | 3/2013 | Kalje |
| 2013/0207630 | A1 | 8/2013 | Rahardjo et al. |
| 2013/0265022 | A1 | 10/2013 | Ulbrich |

(Continued)

OTHER PUBLICATIONS

Luo et al., "Methods and Systems for Calibration of Voltage Regulator Systems With Multiple Types of Power Stages", U.S. Appl. No. 14/470,217, filed Aug. 27, 2014, 38 pgs.

(Continued)

*Primary Examiner* — Ricky Ngon
(74) *Attorney, Agent, or Firm* — Egan, Peterman, Enders & Huston LLP.

(57) ABSTRACT

Systems and methods are disclosed that may be employed to calibrate current sense circuitry of CPU core voltage (Vcore) DC/DC voltage regulation circuitry by coupling an individual Vcore phase of a VR as a current source to a VSA phase of the same VR so that the Vcore phase acts as a current sink for the coupled Vcore phase during calibration of the current sense circuitry of the individual Vcore phase.

20 Claims, 4 Drawing Sheets

(56) References Cited

U.S. PATENT DOCUMENTS

| | | |
|---|---|---|
| 2013/0278234 A1 | 10/2013 | Kreliner |
| 2013/0318371 A1 | 11/2013 | Hormuth |
| 2014/0082236 A1 | 3/2014 | Zhang et al. |
| 2014/0232420 A1 | 8/2014 | Luo et al. |
| 2015/0188425 A1 | 7/2015 | Chang et al. |

OTHER PUBLICATIONS

System Power States, Printed From Internet Aug. 25, 2014, 2 pgs.

Intel, "$2^{nd}$ Generation Intel Core Processor Family Mobile With ECC", Datasheet Addendum, May 2012, 42 pgs.

Richards et al., "Calibration of Voltage Regulator", U.S. Appl. No. 14/334,122, filed Jul. 17, 2014, 32 pgs.

Luo et al., "Methods and Systems for Improving Light Load Efficiency for Power Stages of Multi Phase Voltage Regulator Circuits", U.S. Appl. No. 14/470,344, filed Aug. 27, 2014, 38 pgs.

Luo et al., "Methods and Systems for Implementing Adaptive Fet Drive Voltage Optimization for Power Stages of Multi Phase Voltage Regulator Circuits", U.S. Appl. No. 14/470,455, filed Aug. 27, 2014, 36 pgs.

Luo et al., "Methods and Systems for Defective Phase Identification and Current Sense Calibration for Multi-Phase Voltage Regulator Circuits", Filed Feb. 15, 2013, U.S. Appl. No. 13/768,357, 30 pgs.

\* cited by examiner

SYSTEMS AND METHODS OF CURRENT SENSE CALIBRATION FOR VOLTAGE REGULATOR CIRCUITS

FIELD OF THE INVENTION

This application relates to information handling systems, and more particularly to voltage regulator (VR) circuitry.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

High current information handling system loads that include a CPU typically utilize multi-phase voltage regulators (VR's) that include multiple CPU core voltage (Vcore) phases that are coupled together to provide power via a first Vcore power rail to the main core of a CPU. In one case, a conventional VR may include six such Vcore phases. A power stage of each Vcore phase is usually composed of a MOSFET (metal oxide semiconductor field effect transistor) driver, a high-side MOSFET, a low-side MOSFET and an inductor with all the phase inductors being tied together at their output to the first power rail. One example of such a multi-phase VR architecture may be found in U.S. Pat. No. 7,999,520. A VR can also include a separate additional "VSA" rail coupled to provide power separately via a second VSA power rail to non-core circuitry of a CPU, such as oscillators, memory, etc. In such a case, a VR controller is coupled to simultaneously control each of the multiple Vcore phases and the additional VSA rail. In some cases, a multi-phase VR may include multiple Vmem power stages coupled to provide power separately via a third Vmem power rail to integrated memory controller circuitry of a CPU.

Each given one of the multiple Vcore phases of a multi-phase voltage regulator includes a DC/DC voltage regulation circuitry (or a Vcore regulator circuit) that includes inductor direct-current resistance (DCR) current sense circuitry that is used to sense a value of current drawn from the given VR phase by the main core of the CPU of an information handling system, and each VR phase provides this sensed Vcore current value to the CPU. The CPU in turn uses the sensed Vcore current of the multiple VR phases to determine the total amount of power being drawn by the CPU, and to compare this total CPU power consumption to maximum allowable CPU power limit so as to maintain maximum CPU performance without exceeding the maximum allowable CPU power limit. In this regard, the CPU will reduce CPU power consumption (together with CPU performance) when the actual CPU power consumption approaches the maximum allowable CPU power consumption value to keep actual the CPU power consumption from exceeding the maximum allowable value, and will increase the CPU power consumption (together with CPU performance) when the actual CPU power consumption drops below the maximum allowable CPU power consumption value so as to maximize CPU performance when possible.

In a conventional information handling system, accuracy of the current sense circuitry of the CPU Vcore regulator circuit has a large impact on system performance and reliability. In particular, when the magnitude of Vcore current is under-sensed this will impact the system reliability, and when the magnitude of CPU Vcore current is over-sensed this will impact the CPU performance. The accuracy of the current sense circuitry of the CPU Vcore regulator circuit depends on the tolerances of the inductor DCR and of the sense circuitry used. For example, a typical inductor DCR tolerance is +/−7%, and therefore the reported power consumption for a given CPU may be over-sensed as 200 Watts when it is actually only 185 Watts. Thus, if the CPU has a maximum allowable CPU power consumption value of 200 Watts, then the CPU may throttle back due to this over-sensed power consumption and adversely impact system performance. In an attempt to calibrate the CPU Vcore regulator circuit, previous methods have used a passive load turned on and off by a switch. However, this conventional calibration technique occurs at only one load point. Other conventional Vcore regulator circuit calibration techniques have used an external load coupled to the VR and calibration routines performed by a controller external to the VR, and have proposed using a controlled source connected to the output of the multiple VR phases. However, all of these conventional methods increase the solution cost and pose a safety risk since the VR phases are in open loop during calibration.

SUMMARY OF THE INVENTION

Disclosed herein are systems and methods that may be employed to calibrate current sense circuitry of CPU core voltage (Vcore) DC/DC voltage regulation circuitry of a multi-phase voltage regulator (VR) that is coupled to supply power to a CPU of an information handling system via separate and different Vcore and VSA power supply rails. The disclosed systems and methods may be implemented by coupling an individual Vcore phase of a VR as a current source to a VSA phase of the same VR so that the Vcore phase acts as a current source or sink for the coupled Vcore phase during calibration of the current sense circuitry of the individual Vcore phase. For example, an individual Vcore phase may be so coupled to a VSA phase, e.g., by connecting a resistive element such as an external resistor between the Vcore and VSA phases to close the circuit during an in-circuit testing ("ICT") procedure.

In one exemplary embodiment, a VR controller may be utilized to simultaneously control each individual Vcore phase ("N phase") together with the VSA phase ("N+1 phase") of a VR to separately calibrate the current sense circuitry of the individual Vcore phase. In such an embodiment, there is one master once the VR controller gets the command to perform the current sense circuitry calibration, and the VR controller then proceeds with minimum external operations. Calibration may proceed by sequentially coupling each given one of the Vcore phases separately and one at a time across a resistive element to the VSA phase for current sense circuitry calibration, and this process may be repeated until the current sense circuitry of each of the Vcore phases has been separately calibrated.

To calibrate the current sense circuitry of a given one of the Vcore phases, the VR controller may initially set the given Vcore phase output and the coupled VSA phase output at same voltage value, which may correspond to an output voltage regulation set point of the VSA phase. The VR controller may then increase the Vcore phase output voltage relative to the VSA output voltage to a first elevated Vcore voltage to cause current of a first value to flow across the resistive element into the output capacitor/s of the VSA phase, which tends to cause the VSA phase output capacitor voltage to rise to the level of the Vcore phase output. In response to this perceived voltage rise, the VSA phase sources the current back into the input to maintain its output voltage at the lower VSA output voltage regulation set point so that the current of the first value continues to flow from Vcore phase to VSA phase. The first value of this current flow may be calculated based on the known resistance of the restive element and the output voltage of each of the Vcore phase and VSA phase at this first Vcore phase output voltage setting. At the same time, a first sensed value of Vcore current flow may be measured by the current sense circuitry of the given Vcore phase, and both the first calculated value of current flow and the first sensed value of current flow recorded.

The VR controller may then change the Vcore phase output voltage relative to the VSA output voltage to at least one additional second and different (greater or lesser) Vcore voltage to cause current of a second value to flow across the resistive element into the output capacitor/s of the VSA phase. The second value of this current flow may be calculated based on the known resistance of the restive element and the output voltage of each of the Vcore phase and VSA phase at this second Vcore phase output voltage setting. At the same time, a second sensed value of Vcore current flow may be measured by the current sense circuitry of the given Vcore phase, and both the second calculated value of current flow and the second sensed value of current flow recorded. The first and second calculated values of current flow may then be used in combination with the first and second sensed values of current flow to solve for gain and offset correction values to be applied to the sensed current values obtained from the current sense circuitry of the given Vcore phase, and these gain and offset values stored for future use to correct the sensed current values obtained from the current sense circuitry of the given Vcore phase. This process may be repeated to obtain stored gain and offset correction values to be applied to the sensed current values obtained from the current sense circuitry of each of the individual Vcore phases. Where present, this process may also be repeated to calibrate current sense circuitry of individual Vmem phases that may be provided in some VR embodiments to supply power to a CPU of an information handling system via a separate Vmem power supply rail.

Advantageously, the disclosed systems and methods may be implemented in one exemplary embodiment without requiring any additional VR circuitry components, but rather employing existing VR controller and other VR circuitry in combination with a test fixture configured to couple a resistive element between the existing Vcore phase output and the existing VSA phase output of a multi-phase VR.

Once so coupled, the existing VR controller may be employed to manage calibration of the current sense circuitry of individual Vcore phases by controlling the VSA phase to act as an active load that is selectable over a range that is controllable by the VR controller, and without the additional cost or space that would be associated with new VR circuitry components. Using the disclosed systems and methods allows current sense circuitry of Vcore phases to be better and more accurately calibrated so as to improve CPU performance for information handling systems, such as servers, without additional information handling system cost or need for additional complex circuitry. In one embodiment, more accurately calibrated Vcore phase current sense circuitry allows the coupled CPU to utilized the full power capability of the CPU and memory VRs that include MOSFETs, inductors, controller, etc.

In one respect, disclosed herein, is a method of calibrating current sense circuitry coupled in the output of a first CPU core voltage (Vcore) phase of a voltage regulator (VR). The method may include: electrically coupling an output of the first Vcore phase to an output of a VSA phase of the VR; using at least one processing device of the VR to control the output voltage of the first Vcore phase and the output voltage of the VSA phase to cause a first current to flow between the first Vcore phase output and the VSA phase output; using at least one processing device of the VR to control the output voltage of the first Vcore phase and the output voltage of the VSA phase to cause a second current to flow between the first Vcore phase output and the VSA phase output, the second current being different than the first current; and using at least one processing device of the VR to calibrate the current sense circuitry of the VR based on a relationship between values of the first and second currents as determined by the processing device based on measurements received from the current sense circuitry of the VR compared to values of the first and second currents as calculated based on a difference between the first Vcore phase output voltage and the VSA phase output voltage while each of the first and second currents are flowing between the first Vcore phase output and the VSA phase output.

In another respect, disclosed herein is a voltage regulator (VR) system, including: a first CPU core voltage (Vcore) phase and a VSA phase; current sense circuitry coupled in the output of the Vcore circuitry; and at least one processing device coupled to the current sense circuitry, the processing device being and coupled to control output voltage of each of the first Vcore phase and the VSA phase. The processing device may be configured to: control the output voltage of the first Vcore phase and the output voltage of the VSA phase to cause a first current to flow between the first Vcore phase output and the VSA phase output when an output of the first Vcore phase is electrically coupled to an output of the VSA phase; control the output voltage of the first Vcore phase and the output voltage of the VSA phase to cause a second current to flow between the first Vcore phase output and the VSA phase output, when the output of the first Vcore phase is electrically coupled to the output of the VSA phase the second current being different than the first current; and calibrate the current sense circuitry of the VR based on a relationship between values of the first and second currents as determined by the processing device based on measurements received from the current sense circuitry of the VR compared to values of the first and second currents as calculated based on a difference between the first Vcore phase output voltage and the VSA phase output voltage while each of the first and second currents are flowing between the first Vcore phase output and the VSA phase output.

DESCRIPTION OF ILLUSTRATIVE EMBODIMENTS

Figure 1:
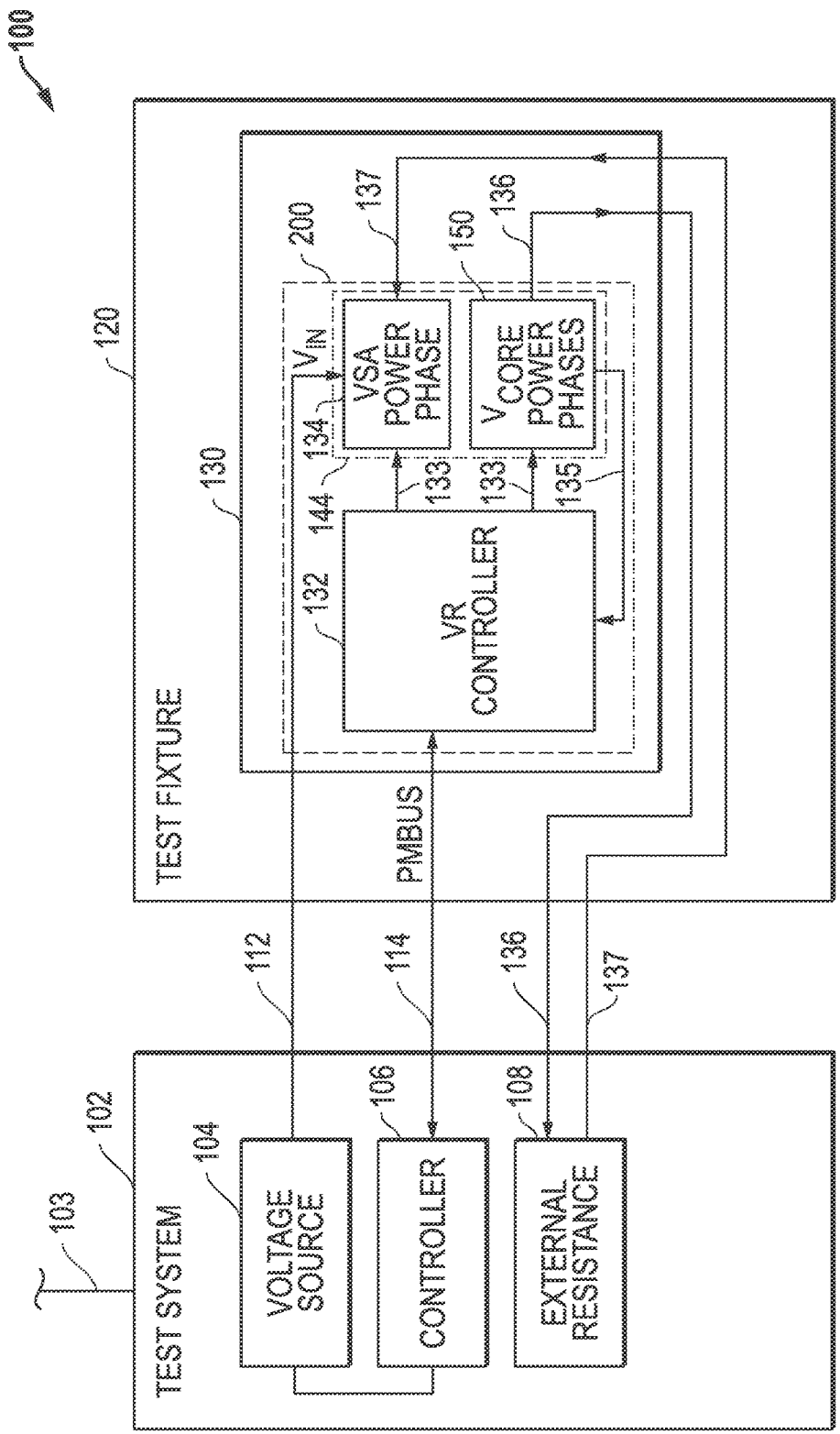
FIG. 1 is a block diagram illustrating a test configuration according to one exemplary embodiment of the disclosed systems and methods.

FIG. 1 is a block diagram illustrating one exemplary embodiment of a test configuration 100 as it may be implemented to calibrate current sense circuitry of individual Vcore power phases of a multi-phase VR circuitry device or system 200. Possible examples of such multi-phase VR circuitry include, but are not limited to, VR circuitry on a PCBA (e.g., such as a motherboard or other type of board) or other electrical assembly unit (e.g., such as a PSU). In one exemplary embodiment of FIG. 1, the multi-phase VR 200 may include a digital VR controller 132 that is integrated on (e.g., coupled on) a PCBA 130 or that is otherwise integrated as a part of VR system 200 to control multiple power stages 144 that are configured for powering a central processing unit (CPU) such as an Intel Pentium series processor, an Advanced Micro Devices (AMD) processor or other type of host processing device, e.g., Intel x86 processor, AMD x86 processor, ARM core processor, or other type of host processing device. In the illustrated embodiment, power stages 144 include multiple individual Vcore phases 150 and at least one VSA phase 134, and VR controller 132 is coupled to control each of power stages 144 using phase control signals 133 that may be, for example, a plurality of enable (EN*) signals and pulse width modulation (PWM) signals as will be described further herein. VR controller 132 may be implemented by any one or more suitable processing devices, e.g., such as such as controller, microcontroller, processor, microprocessor, FPGA, ASIC, etc.

Although multiple power stages 144 of FIG. 1 are shown to include a combination of Vcore power stages 150 and VSA power stage 134, it will be understood that power stages 144 may also or alternatively include other type/s of individual power stages that may be calibrated using the disclosed systems and method, e.g., such as one or more Vmem power stages that may be provided for powering integrated memory controller circuitry within a CPU. For example, in one exemplary embodiment multi-phase VR circuitry may include multiple (e.g., six) Vcore power stages coupled to a common Vcore power rail for powering main core of a CPU, multiple (e.g., two to three) Vmem power stages coupled to a second separate common Vmem power rail for powering an integrated memory controller circuitry within a CPU, and a VSA power stage coupled to a third separate common power rail for powering non-core circuitry of a CPU.

Still referring to the exemplary embodiment of FIG. 1, voltage and current sensing signals 135 may be provided as shown from the Vcore and VSA power phases 144 to VR controller 132. As shown, PCBA 130 may be received in an ICT test fixture 120 which may be, for example, a bed of nails test fixture having pins configured for alignment with appropriate test pads provided on the PCBA 130 that are coupled to VR controller 132 and power phase 144 circuit components of the VR in a manner to allow the testing methodology described further herein. It will be understood that a test system 100 may alternatively be configured to test and/or calibrate multi-phase VR circuitry device/s on any other type of board or system 130 having multi-phase VR circuitry.

It will be understood that the embodiment of FIG. 1 is exemplary only, and that any other test system configuration suitable for exchanging digital communication signals and/or voltage signals to accomplish the disclosed testing methodology may be employed, e.g., such as boundary scan techniques, etc. Moreover, any suitable manner of temporarily coupling between a test system and a multi-phase VR for testing may be employed that allows decoupling of the VR and test system components from each other that allows the multi-phase VR to be separated intact from the test system and used for its intended purposes (e.g., installation in a separate information handling system such as server, desktop computer, notebook computer, PDA, cell phone, etc.) following testing. Examples of manners for such temporary coupling include, but are not limited to, pins and corresponding test pads, test cables/connectors, etc.

Still referring to the exemplary embodiment of FIG. 1, test system 102 includes a voltage source 104 coupled to provide an input voltage 112 to power phases 144 of PCBA 130 via test fixture 120. However, it will be understood that it is possible that such a voltage source may be alternatively provided within test fixture 120 to place the voltage source closer to multi-phase VR circuitry device 200, e.g., to minimize chance for occurrence of additional spikes during high current operation or transient. Test system 102 also includes an external resistance 108 (e.g., one or more resistors or other type/s and/or combination of circuit components that provide resistance to current flow) that may be coupled via test fixture 120 to conduct current between individual Vcore power stages 150 and VSA power stage 134 in a manner as described further herein. In one embodiment, a shunt resistance value (R1) of resistive element 108 may be selected to be much greater (e.g., by from about 5000 to about 10,000 ohms greater) than contact resistance between ICT test fixture 120 and PCBA 130 in order increase accuracy of calculation, although values of R1 that are greater than about 10,000 ohms or less than about 5000 ohms greater than contact resistance of fixture 120 are also possible.

As further shown in FIG. 1, test system 102 also includes a test system controller 106 (e.g., a processing device such as controller, microcontroller, processor, microprocessor, FPGA, ASIC, etc.) that is configured to provide test system control signals via a digital communication bus 114, e.g., such as I²C or a power management bus "PMBus", system management bus "SMBus", etc. Test system 102 may be optionally communicatively coupled (e.g., across a suitable network communication medium or connection 103) to communicate multi-stage VR test results from the test system controller 106 to external processing device/s or system/s, e.g., such as a test data collection system at a PCBA manufacturer site that controls quality for the production line.

It will be understood that FIG. 1 is exemplary only, and that in another embodiment, an integrated processing device of a VR system 200 or of an information handling system (e.g., such as a remote access controller of a server system coupled to VR system 200) may be employed to initiate a calibration process for current sense circuitry of individual Vcore power phases of VR system 200, e.g., such as after VR system 200 has been installed within a host information system such as server system, desktop or notebook computer system, etc. For example, in one exemplary embodiment calibration may be performed autonomously through a server management system or remote access controller with minimum external connections and interactions required, e.g., only an external resistance 108 may be present to conduct current between individual Vcore power stages 150 and VSA power stage 134 without requiring an external test system controller 106 and/or without requiring an external voltage source 104. Further alternatively, an internal resistance corresponding to external resistance 108 may be coupled to conduct current between individual Vcore power stages 150 and VSA power stage 134, e.g., with no connections required to any devices external to a host information handling system.

Examples of remote access controllers that may be employed as above include, but are not limited to, an integrated Dell Remote Access Controller (iDRAC) available from Dell Products L.P. of Round Rock, Tex. Moreover, it is also possible that methodology 400 described below may alternatively be implemented using other suitable system processing device/s besides VR controller 302. Examples of server system controllers, memory and the like may be found in United States Patent Application Publication Number 20120275610 and U.S. patent application Ser. No. 13/477,837, filed May 22, 2012, each of which is incorporated herein by reference in its entirety.

Figure 2:
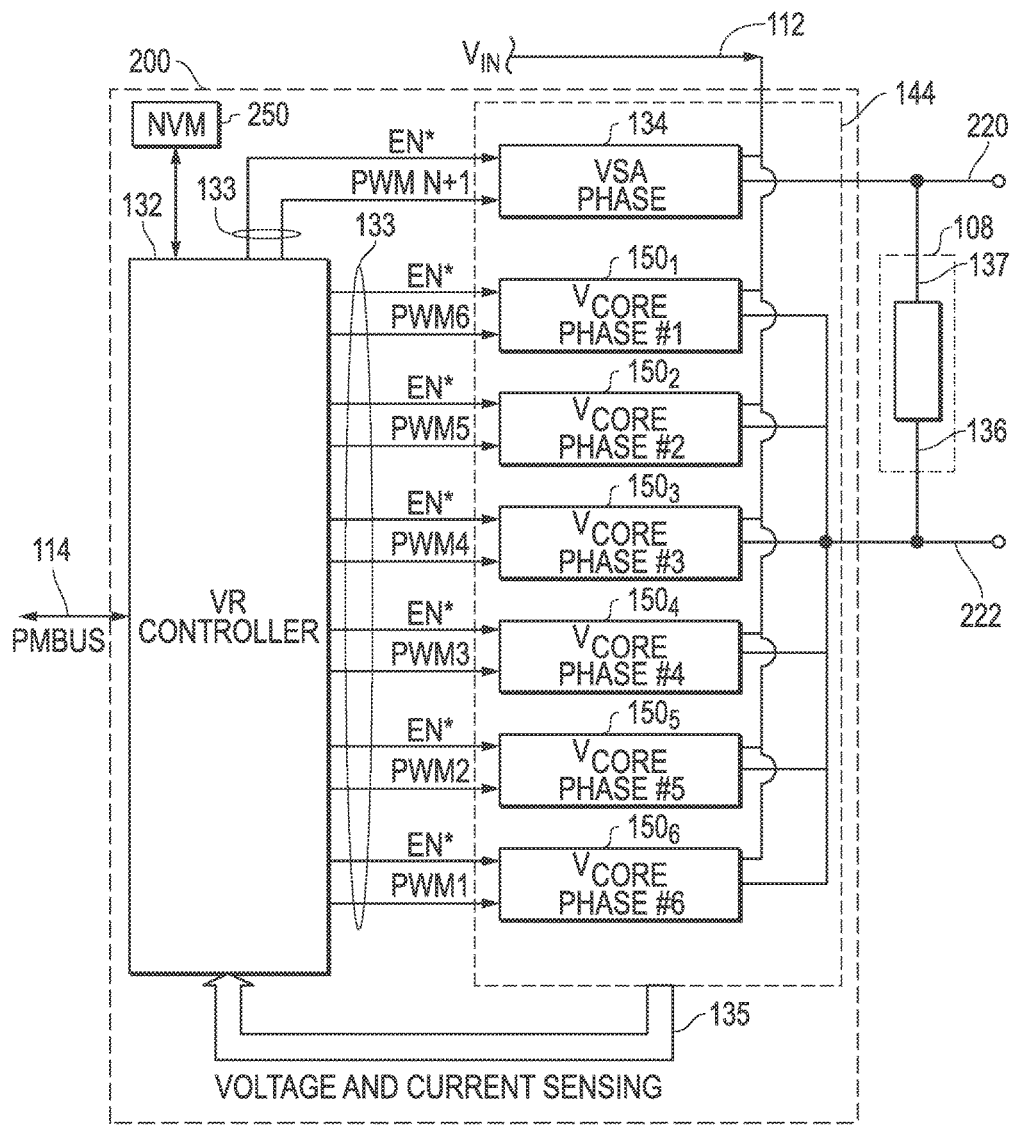
FIG. 2 is a block diagram illustrating a multi-phase VR according to one exemplary embodiment of the disclosed systems and methods.

FIG. 2 illustrates one exemplary embodiment of a multi-phase VR 200 such as may be provided on PCBA 130 of FIG. 1, as it may be coupled to test system 102 for current sense calibration. As shown, in this embodiment VR 200 includes a digital VR controller 132 that is coupled to six Vcore power phases $150_1$-$150_6$ (i.e., N=6 power stages) and a single VSA power phase 134. In this embodiment, multiple Vcore power phases $150_1$-$150_6$ are coupled to selectably provide power to Vcore power rail 222 for powering main core of a CPU. VSA power phase 134 is coupled to provide power to VSA power rail 220 to power non-core circuitry of the CPU. In this regard, Vcore power rail 222 and VSA power rail 220 are separate power rails that are not coupled together by circuitry of VR 200, but rather are only coupled together during ICT testing as shown by current paths 136/137 and resistive elements 108 of test system 102. FIG. 2 also illustrates non-volatile memory 250 that is coupled to VR controller 132 for retrieval and storage of data and/or instructions (e.g., such as firmware code).

Still referring to FIG. 2, VR controller 132 is configured in this embodiment to control power phases $150_1$-$150_6$ to drive them together as a multi-phase VR by using phase control signals 133 in the form of a plurality of enable (EN*) signals and pulse width modulation (PWM) signals. In this regard, VR controller 132 may be coupled to control each Vcore power phase 150 via a corresponding MOSFET switching device driver (not shown) that may be integrated within each power phase 150. When ultimately installed to power one or more components of an information handling system that may vary in power requirement, one or more of the six Vcore power phases may be selectably enabled in order to provide power to Vcore power rail 222 according to the actual power requirements of the main CPU core. For example, all six Vcore phases may be used to provide a highest system load power level, only four Vcore phases may be used to power a relatively lower system load power level, only three Vcore phases may be used to power an even lower system load power level, etc. Further information on multi-stage VR configuration and operation may be found, for example, described in U.S. Pat. No. 7,999,520 and in U.S. patent application Ser. No. 13/768,357 filed Feb. 15, 2013, each of which is incorporated herein by reference in its entirety.

Also shown in FIG. 2 are input voltage 112 provided from voltage source 104 of test system 102 to power phases 144 during test, as well as external resistive element 108 of test system 102 that is coupled between Vcore power rail 222 and VSA power rail 220, e.g., by current paths 136 and 137 via test fixture 120. Voltage and current sensing signals 135 are also shown provided from power phases 144 to VR controller 132.

Figure 3:
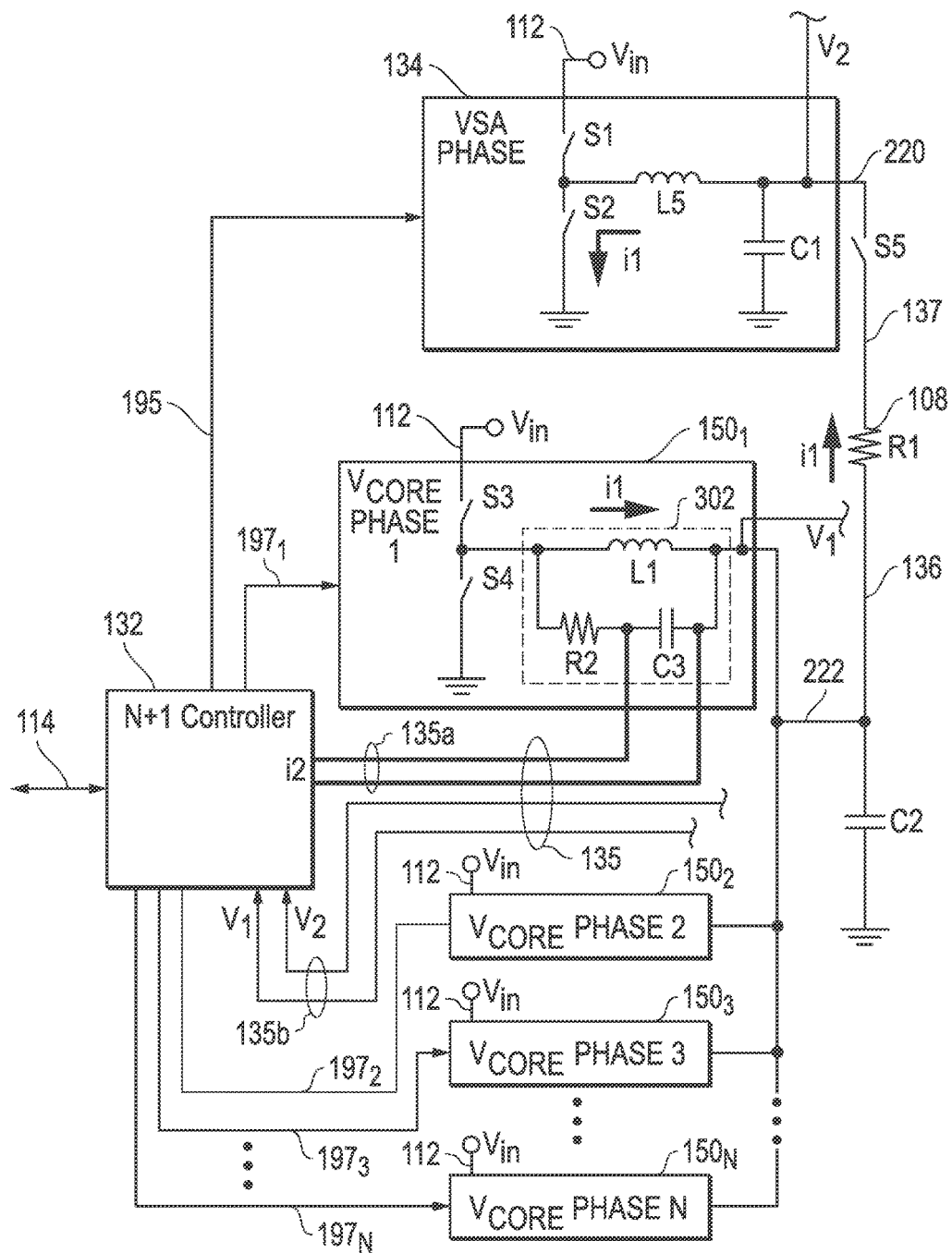
FIG. 3 is a block diagram illustrating relationship of an individual Vcore phase and a VSA phase during current sense calibration according to one exemplary embodiment of the disclosed systems and methods.
Figure 4:
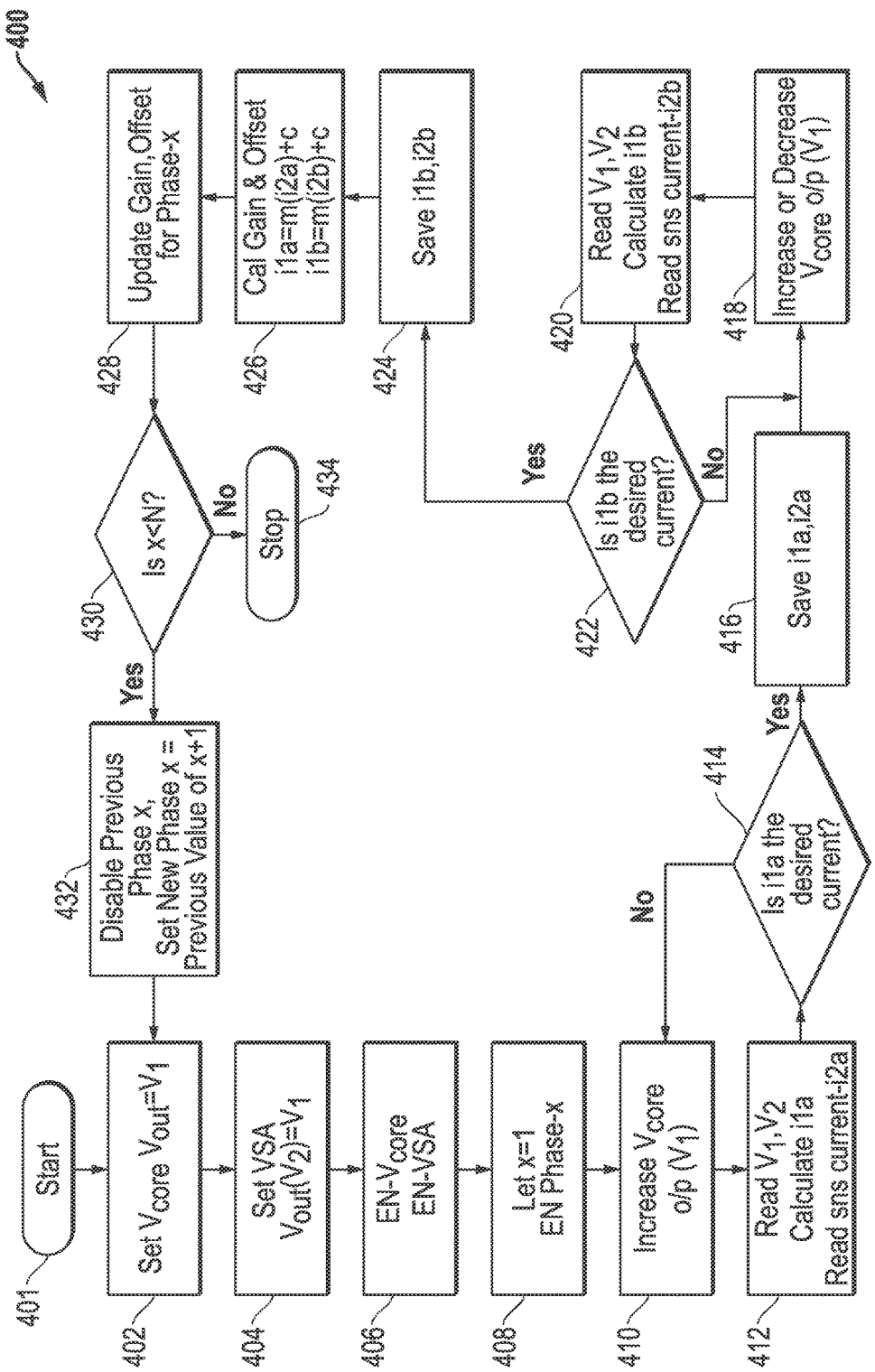
FIG. 4 illustrates methodology that may be implemented according to one exemplary embodiment of the disclosed systems and methods.

FIG. 3 illustrates relationship and current flow between a selected individual Vcore phase $150_1$ and VSA phase 134 of VR system 200 during current sense calibration according to one exemplary embodiment of the disclosed systems and methods such as described further herein in relation to FIG. 4. It will be understood that each of the other Vcore phases $150_2$-$150_N$ may be configured with the same or similar circuit components, and may be similarly coupled and controlled for current sense calibration. Further, current sense circuitry of other types of power phases, e.g., such as Vmem power phases that are coupled to a separate Vmem power rail may also be calibrated in a similar manner, e.g., by coupling the Vmem power rail to the VSA power rail and implementing the methodology of FIG. 4.

As shown in FIG. 3, Vcore power rail 222 is coupled to VSA power rail 220 by external resistive element 108 (e.g., R1) of test system 102 to allow current i1 to flow from Vcore phase $150_1$ to VSA phase 134, in this case through an optional switch S5 and current paths 136 and 137 of test fixture 120, it being understood that optional switch S5 is closed by test system controller 106 during this current flow. In another possible exemplary embodiment, no switching device such as switch S5 may be present between current path 137 and VSA power rail 220, but rather the circuit may be open between current path 137 and VSA power rail 220 until it is closed when external resistance 108 is temporarily electrically coupled between current path 137 and VSA power rail 220 using connections provided on PCBA of multi-phase VR system 200, e.g., such as pins and corresponding test pads, test cables/connectors, etc.

As shown, control signals 195 and 197 are provided by VR controller 132 to control operation (e.g., output voltage, power state, etc.) of each of VSA phase 134 and each of VR phases 150, respectively. Also illustrated in FIG. 3 are DCR current sense components 302 (i.e., L1, R2 and C3) of Vcore phase $150_1$. VR (N+1) controller 132 may be operatively coupled as shown by current sense signal paths 135a to sense real time voltage across capacitor C3 of DCR current sense circuitry 302 that equals real time voltage across inductor L1 DCR that is representative of actual current flow i1 from Vcore phase $150_1$, as well as to receive real time sensed values of Vcore phase output voltage V1 and VSA phase output voltage V2 via voltage sense signal paths 135b. Also shown in FIG. 3 are switches S1 and S2 (e.g., MOSFETs) of VSA phase 134 and switches S3 and S4 (e.g., MOSFETs) of Vcore phase $150_1$ that may be driven by a MOSFET switching device driver (not shown) under the control of VR controller 132. Inductors L1 and L5 are coupled between the switching devices and the output of each of Vcore phase $150_1$ and VSA phase 134, respectively, as shown.

FIG. 4 illustrates one exemplary embodiment of methodology 400 that may be implemented for calibration of current sense circuitry 302 of individual Vcore phases $150_1$ to $150_N$ of a VR system 200 such as illustrated in FIG. 3. In one embodiment, methodology 400 may be performed as an ICT test procedure, and VR controller 132 may perform one or more of the steps of methodology 400 in response to testing control signals provided by test system controller 106 across digital communication bus 114 (or alternatively provided across a suitable digital communications path by a remote access controller such as iDRAC. Although methodology 400 is described below with reference to the embodiment of FIG. 3, it will be understood that similar steps may be applied to other embodiments of VR controller configuration. Moreover, it will be understood that similar methodology may be implemented for calibration of other types of power phases, e.g., such as Vmem power phases. Instructions for completing one or more steps of methodology 400 may be stored as firmware code or other suitable computer program of instructions on non-volatile memory 250 that is coupled to be accessible by VR controller 132 and/or one or more other memory devices accessible to test system controller 106 and/or remote access controller (e.g., iDRAC).

Methodology 400 of FIG. 4 begins in step 401 with Vcore power rail 222 coupled to VSA power rail 220 by resistive element 108 and optional switch element S5 where provided, e.g., with switch S5 open to electrically isolate Vcore power rail 222 from VSA power rail 220. In step 402, VR controller 132 may set the Vcore voltage output (Vcore Vout) for the Vcore power phases 150 to be equal to a selected Vcore output voltage value V1. In step 404, VR controller 132 may set the VSA voltage output (VSA Vout) of VSA phase 134 to be equal to a selected VSA output voltage value V2 that is initially equal to V1, such as 1 volt or any other suitable greater or lesser initial voltage value. However, it is possible in other embodiments that V1 and V2 may be initially set to different voltage output values. Next, in step 406, VR controller 132 may enable all Vcore phases $150_{1-N}$ together with VSA phase 134 to ensure that all VSA and Vcore phases are operative and functioning properly at their normal output voltage, e.g., V1=1 volt and V2=1.5 volts. Next, in step 408, VR controller 132 may first select and selectively enable only Vcore phase $150_1$ in step 408 by setting x=1 for the first iteration of methodology 400, leaving the remaining other (nonselected) Vcore phases 150 in disabled condition. Once enabled in step 408, the selected Vcore phase $150_x$ provides the initial selected value of V1 to Vcore power rail 222, and VSA phase 134 provides the initial selected V2 to VSA power rail 220. When present, optional switch S5 is then closed by test system controller 106 to electrically connect Vcore power rail 222 to VSA power rail 220. At this time no current flows from Vcore power rail 222 to VSA power rail 220 through resistive element 108 in those embodiments where V1 is initially set equal to V2 and VSA output capacitor C1 has been previously charged prior to closing switch S5. Alternatively, VSA core 132 may be disabled when Vcore phase/s 150 are initially enabled and switch S5 is closed, in which case current will flow across R1 until VSA output capacitor C1 is charged.

Next, in step 410, VR controller 132 may increase the output voltage (V1) of the currently selected Vcore phase $150_x$, and then read the resulting values of V1 and V2 from voltage sensing signals 135b in step 412 as shown in FIG. 3. The value of Vcore output voltage V1 may be increased by VR controller 132 in one step to a pre-determined voltage value, or alternatively may be increased incrementally until the calculated value of Vcore current (i1a) flowing from Vcore power rail 222 to VSA power rail 220 through resistive element 108 meets or exceeds a pre-determined first desired Vcore current value threshold, e.g., such as 10 amperes or any other suitable greater or lesser pre-determined first Vcore current threshold value. For example, in the embodiment of FIG. 4, the value of Vcore output voltage V1 may be incrementally increased in step 410 by a relatively small amount relative to the VSA output voltage V2, e.g., such as by an incremental amount of from about 3 to about 5 volts (e.g., depending on the value of resistance of external resistance 108), although incremental V1 voltage increases of less than 3 volts and greater than 5 volts are also possible. Next, in step 412, the resulting value of i1a may be calculated by VR controller 132 from the actual resulting real time sensed voltage values of V1 and V2 following the incremental increase in V1 that was made in step 410, for example by using the following equation: i1a=(V1−V2)/R1, where R1 is the shunt resistance value of resistive element 108. VR controller 132 may determine shunt resistance value R1 by, for example, retrieving a stored resistance value corresponding to R1 stored in non-volatile memory 250 coupled or otherwise accessible by VR controller 132.

Next, in step 414 the calculated value of i1a from step 412 may be compared to a pre-determined desired first current value, e.g., such as a first desired threshold Vcore value. For example, if the calculated value of i1a is not found to be greater than or equal to a pre-determined first desired current threshold value in step 414, then steps 410 and 412 are repeated as shown until i1a is found to be greater than or equal to the pre-determined first desired threshold Vcore current value. Each time step 412 is performed, a sensed value of Vcore current (i2a) from inductor current sense (DCR) circuitry 302 may be at the same time read from current sensing signals 135a, e.g., in the manner as shown in FIG. 3.

Once the calculated real time value of i1a is found in step 414 to equal the desired value (e.g., the calculated i1a is greater than or equal to the pre-determined first desired current value threshold), then methodology 400 proceeds to step 416 where the last calculated Vcore current value i1a and the last sensed DCR Vcore current value i2a obtained from step 412 are stored by VR controller 132 for future use, e.g., in non-volatile memory 250 coupled to VR controller 132, and/or other non-volatile memory accessible by a remote access controller and/or test system controller 106.

Methodology 400 then proceeds to step 418 where the value of Vcore output voltage V1 may be incrementally increased or decreased from the Vcore output voltage value V1 from the last iteration of step 410, e.g., such as by an incremental amount from about 3 to about 5 volts depending on the value of resistance of external resistance 108), although incremental V1 voltage increases of less than 3 volts and greater than 5 volts are also possible. Next, in step 420, the resulting value of i1b may be calculated from the actual resulting real time sensed voltage values of V1 and V2 following the incremental increase (or decrease) in V1 that was made in step 418. Then, in step 422 the calculated value of i1b from step 420 may be compared to a pre-determined second desired Vcore current value criteria. For example, for a Vcore voltage increase in step 418 such a criteria may be whether the new calculated value of i1b is found to be greater than or equal to a pre-determined second desired threshold Vcore current value. For a Vcore voltage decrease in step 418 such a criteria may be whether the new calculated value of i1b is found to be less than or equal to a pre-determined second desired threshold Vcore current value.

As an example, where Vcore voltage V1 is increased with each iteration of step 418, then the calculated value of i1b from step 420 may be compared to a pre-determined second desired Vcore current threshold value e.g., such as 20 amperes. If in step 422, the calculated value of i1b is not found to be greater than or equal to the pre-determined second desired threshold Vcore current value, then steps 418 and 420 are repeated as shown until i1b is found to be greater than or equal to the pre-determined second desired threshold Vcore current value. Each time step 420 is performed, a sensed value of Vcore current (i2b) from inductor current sense circuitry 302 may be at the same time read from current sensing signals 135*a*. Once the calculated real time value of i1b is found in step 414 to be greater than or equal to the pre-determined second desired current value threshold, then methodology 400 proceeds to step 424 where the last calculated Vcore current value i1b and the last sensed DCR Vcore current value i2b obtained from step 420 are stored by VR controller 132 for future use. Where Vcore voltage V1 is decreased with each iteration of step 418, a similar methodology may be employed until the calculated real time value of i1b is found in step 414 to be less than or equal to the pre-determined second desired current value threshold.

Next, in step 426, calibration gain and offset values for current sense DCR circuitry 302 of the currently-tested Vcore phase 150$_x$ may be calculated based on the two pairs (i1*a*, i2*a* and i1*b*, i2*b*) of different calculated Vcore current flow (i1) values and their corresponding respective DCR-sensed Vcore current flow (i2) values, e.g., by solving two equations to determine the two unknowns of gain (m) and offset (c) to calibrate the DCR circuitry 302 as follows:

$$i1a = m(i2a) + c;\ \text{and}$$

$$i1b = m(i2b) + c.$$

For example, in one exemplary embodiment, values of m and c may be calculated using the below relationships:

$$m = (i1b - i1a)/(i2b - i2a)$$

$$c = i1a - m*(i2a).$$

Next, in step 428, the gain and offset values for the currently-tested Vcore phase 150$_x$ may be updated with the newly calculated values of gain and offset values from step 426, e.g., by saving or storing these calculated values of gain and offset values in VR controller memory 250 or other suitable memory storage device. Methodology 400 then proceeds to step 430 where it is determined whether "x" of the currently tested Vcore phases 150$_x$ is less than the value of "N" which represents the total number of Vcore phases 150 of a given tested VR system 200. If the currently tested Vcore phase 150$_x$, is the last Vcore phase 150 (i.e., x=N) to be calibrated, then methodology 400 terminates in step 434 as shown. However, if the currently tested Vcore phase 150$_x$ is not the Nth (last) Vcore phase 150, then methodology 400 proceeds to step 432 where VR controller 132 may disable the currently tested Vcore 150$_x$, and then increment the value of x by one (i.e., by setting new x=(previous x+1) so as to correspond to the next individual selected Vcore phase 150$_x$ for DCR sense circuitry calibration). Methodology 400 then returns to step 402 and repeats again and again for each successive Vcore phase 150 until DCR sense circuitry 302 of all "N" Vcore phases have been calibrated, e.g., for a six phase VR system 200 (where N=6) the above sequence is repeated for N=2-3-4-5-6 Vcore phases 150 of the VR system 200, and the corresponding gain and offset registers are calculated and updated for the separate current sense circuitry 302 of each individual VR phase 150.

It will be understood that the methodology 400 of FIG. 4 may implemented to calibrate current sense circuitry for one or more Vcore phases of a multi-phase VR system or device, regardless of the particular number of phases and phases of the multi-phase VR system. It will also be understood that methodology 400 of FIG. 4 may implemented to calibrate current sense circuitry for other types of power phases, e.g., such as Vmem memory phases, etc. Furthermore, it will be understood that the particular steps of methodology 400 are exemplary only, and that any combination of additional and/or alternative steps, and/or any order of the illustrated steps, may be employed that is suitable for calibrating current sense circuitry of individual power phase/s of a VR system by setting Vcore voltage V1 to at least two different voltage values to obtain two different calculated values of Vcore current (i1*a* and i1*b*) that are suitable for solving for current sense gain and offset values, e.g., as described for step 426. For example, it is possible that current sense calibration may be performed using Vcore current i1*a* that is less than i1*b*, e.g., by initially enabling a given Vcore phase 150$_x$ with a first Vcore voltage V1 that results in a first higher Vcore current (i1*a*) that meets or exceeds a pre-determined first desired Vcore current value threshold, and then decreasing the first Vcore voltage V1 to a second lower Vcore voltage that results in a second lower Vcore current (i1*b*) that is equal or less than a pre-determined second desired Vcore current threshold.

It will be understood that one or more of the tasks, functions, or methodologies described herein (e.g., including those described for VR controller 132 and/or test system controller 106) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a processing device of an information handling system such as CPU, controller, microcontroller, processor, microprocessor, FPGA, ASIC, or other suitable processing device) to perform one or more steps of the methodologies disclosed herein. A computer program of instructions may be stored in or on the non-transitory computer-readable medium accessible by an information handling system for instructing the information handling system to execute the computer program of instructions. The computer program of instructions may include an ordered listing of executable instructions for implementing logical functions in the information handling system. The executable instructions may comprise a plurality of code segments operable to instruct the information handling system to perform the methodology disclosed herein. It will also be understood that one or more steps of the present methodologies may be employed in one or more code segments of the computer program. For example, a code segment executed by the information handling system may include one or more steps of the disclosed methodologies.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A method of calibrating current sense circuitry coupled in the output of a first CPU core voltage Vcore phase of a voltage regulator VR, comprising:
    electrically coupling an output of the first Vcore phase to an output of a separate phase of the VR;
    using at least one processing device of the VR to control the output voltage of the first Vcore phase and the output voltage of the separate VR phase to cause a first current to flow between the first Vcore phase output and the separate VR phase output;
    using at least one processing device of the VR to control the output voltage of the first Vcore phase and the output voltage of the separate VR phase to cause a second current to flow between the first Vcore phase output and the separate VR phase output, the second current being different than the first current; and
    using at least one processing device of the VR to calibrate the current sense circuitry of the VR based on a relationship between values of the first and second currents as determined by the processing device based on measurements received from the current sense circuitry of the VR compared to values of the first and second currents as calculated based on a difference between the first Vcore phase output voltage and the separate VR phase output voltage while each of the first and second currents are flowing between the first Vcore phase output and the separate VR phase output.

2. The method of claim 1, where the current sense circuitry comprises inductor direct-current resistance DCR current sense circuitry coupled in the output of the first Vcore phase; and where the method further comprises:
    using at least one processing device of the VR to determine the measured value of each of the first and second currents based on corresponding measurements of voltage across a capacitor of the DCR current sense circuitry while the respective first and second currents are flowing; and
    using at least one processing device of the VR to calculate a value of first current based on a difference between the output voltage of the first Vcore phase and the output voltage of the separate VR phase while the first current is flowing, and calculating a value of the second current based a difference between the output voltage of the first Vcore phase and the output voltage of the separate VR phase while the second current is flowing.

3. The method of claim 1, further comprising electrically coupling the first Vcore phase output to the separate VR phase output across a resistive element that has a resistance value; calculating the value of the first current based on the resistance value and the difference between the output voltage of the first Vcore phase and the output voltage of the separate VR phase while the first current is flowing; and calculating the value of the second current based on the resistance value and the difference between the output voltage of the first Vcore phase and the output voltage of the separate VR phase while the second current is flowing.

4. The method of claim 3, where components of the VR are assembled on a printed circuit board assembly PCBA; where the resistive element comprises an external resistive element; and where the method further comprises:
    providing a test system comprising a test system voltage source, and the external resistive element;
    temporarily coupling the test system to the VR by temporarily coupling the voltage source to provide power to a voltage input of the first Vcore phase and the separate VR phase of the VR, and temporarily coupling the external resistive element of the test system between the first Vcore phase output and the separate VR phase output;
    then performing at least the following steps while the test system is temporarily coupled to the VR:
        using at least one processing device of the VR to control the output voltage of the first Vcore phase and the output voltage of the separate VR phase to cause the first current to flow between the first Vcore phase output and the separate VR phase output through the external resistive element,
        using at least one processing device of the VR to control the output voltage of the first Vcore phase and the output voltage of the separate VR phase to cause the second current to flow between the first Vcore phase output and the separate VR phase output through the resistive element; and
    then decoupling the test system from the VR.

5. The method of claim 4, where the VR comprises a multi-phase VR having multiple individual Vcore phases that each includes a respective individual and separate current sense circuitry; where the test system includes a test fixture configured to receive the PCBA of the multi-phase VR for testing of the individual Vcore phases of the multi-phase VR; and where the method further comprises sequentially performing at least the following steps individually for each Vcore phase while the test system is temporarily coupled to the VR:
    using at least one processing device of the VR to control the output voltage of the Vcore phase and the output voltage of the separate VR phase to cause the first current to flow between the Vcore phase output and the separate VR phase output through the external resistive element;

using at least one processing device of the VR to control the output voltage of the Vcore phase and the output voltage of the separate VR phase to cause the second current to flow between the Vcore phase output and the separate VR phase output through the resistive element; and using at least one processing device of the VR to calibrate the individual and separate current sense circuitry of the Vcore phase based on a relationship between values of the first and second currents as determined by the processing device based on measurements received from the individual and separate current sense circuitry of the Vcore phase compared to values of the first and second currents as calculated based on a difference between the Vcore phase output voltage and the separate VR phase output voltage while each of the first and second currents are flowing between the Vcore phase output and the separate VR phase output.

6. The method of claim 5, further comprising:
performing the respective temporarily coupling steps by temporarily assembling the multi-phase VR PCBA to the test fixture to temporarily couple the test system voltage source to provide power through the test fixture to the voltage input of the multiple phases of the multi-phase VR, to temporarily couple the external resistive element between the output of the multiple Vcore phases and the output of the separate VR phase of the VR; and then performing the decoupling step by de-assembling the multi-phase VR PCB from the test fixture to decouple each of the test system voltage source, and the external resistive element from the multi-phase VR.

7. The method of claim 3, where the VR system comprises a part of an information handling system that includes a remote access controller; and where the method further comprises using the remote access controller to initiate at least the following steps while the VR system is operatively installed in the information handling system:

using at least one processing device of the VR to control the output voltage of the first Vcore phase and the output voltage of the separate VR phase to cause the first current to flow between the first Vcore phase output and the separate VR phase output through the resistive element; and using at least one processing device of the VR to control the output voltage of the first Vcore phase and the output voltage of the separate VR phase to cause the second current to flow between the first Vcore phase output and the separate VR phase output through the resistive element.

8. The method of claim 1, where the VR comprises a multi-phase VR having multiple individual Vcore phases that each includes a respective individual and separate current sense circuitry; and where the method further comprises sequentially performing at least the following steps individually for each of the multiple Vcore phases:

using at least one processing device of the VR to control the output voltage of the Vcore phase and the output voltage of the separate VR phase to cause the first current to flow between the Vcore phase output and the separate VR phase output;

using at least one processing device of the VR to control the output voltage of the Vcore phase and the output voltage of the separate VR phase to cause the second current to flow between the Vcore phase output and the separate VR phase output; and using at least one processing device of the VR to calibrate the individual and separate current sense circuitry of the Vcore phase based on a relationship between values of the first and second currents as determined by the processing device based on measurements received from the individual and separate current sense circuitry of the Vcore phase compared to values of the first and second currents as calculated based on a difference between the Vcore phase output voltage and the separate VR phase output voltage while each of the first and second currents are flowing between the Vcore phase output and the separate VR phase output.

9. The method of claim 1, further comprising:
using at least one processing device of the VR to control the output voltage of the Vcore phase to be greater than the output voltage of the separate VR phase to cause the first current to flow from the Vcore phase output to the separate VR phase output;

using at least one processing device of the VR to control the output voltage of the Vcore phase to be greater than the output voltage of the separate VR phase to cause the second current to flow from the Vcore phase output to the separate VR phase output; and using at least one processing device of the VR to calibrate the individual and separate current sense circuitry of the Vcore phase based on a relationship between values of the first and second currents as determined by the processing device based on measurements received from the individual and separate current sense circuitry of the Vcore phase compared to values of the first and second currents as calculated based on a difference between the Vcore phase output voltage and the separate VR phase output voltage while each of the first and second currents are flowing between the Vcore phase output and the separate VR phase output.

10. The method of claim 1, further comprising electrically coupling the first Vcore phase output to the separate VR phase output across a resistive element that has a resistance value; and using at least one processing device of the VR to:

set an output voltage of the first Vcore phase output to a first Vcore output voltage value and to set an output voltage of the separate VR phase output to a separate VR phase output voltage value that is different than the first Vcore output voltage value so as to cause a first current to flow between the Vcore output and the separate VR phase output through the resistive element, determine a calculated value $i1a$ of the first current based on a resistance value of the resistive element and the difference between the first Vcore output voltage value and the separate VR phase output voltage value, determine a measured value $i2a$ of the first current based on a sensed voltage from the current sense circuitry of the first Vcore phase while the first current is flowing, set an output voltage of the first Vcore phase output to a second Vcore output voltage value that is different than the first Vcore output voltage value and to set an output voltage of the separate VR phase output to a voltage value that is different than the second Vcore output voltage value to cause a second current to flow between the Vcore output and the separate VR phase output through the resistive element, determine a calculated value $i1b$ of the second current based on a resistance value of the resistive element and the difference between the second Vcore output voltage value and the separate VR phase output voltage value, determine a measured value i2b of the second current based on a sensed voltage from the current sense circuitry of the first Vcore phase while the second current is flowing, and determine offset and gain factors to correct measured value of current determined from the current sense circuitry based on a first relationship between the calculated first current value i1a and the measured first current value i2a and a second relationship between the calculated second current value i1b and the measured second current value i2b.

11. The method of claim 1, further comprising electrically coupling the first Vcore phase output to the separate VR phase output across a resistive element that has a resistance value; and using at least one processing device of the VR to:

set an output voltage of the separate VR phase output to a first separate VR output voltage value and to set an output voltage of the Vcore phase output to a Vcore output voltage value that is different than the first separate VR phase output voltage value so as to cause a first current to flow between the Vcore output and the separate VR phase output through the resistive element, determine a calculated value i1a of the first current based on a resistance value of the resistive element and the difference between the Vcore output voltage value and the first separate VR phase output voltage value, determine a measured value i2a of the first current based on a sensed voltage from the current sense circuitry of the first Vcore phase while the first current is flowing, set an output voltage of the first separate VR phase output to a separate VR output voltage value that is different than the first separate VR output voltage value and to set an output voltage of the Vcore phase output to a voltage value that is different than the second separate VR phase output voltage value to cause a second current to flow between the Vcore output and the separate VR phase output through the resistive element, determine a calculated value i1b of the second current based on a resistance value of the resistive element and the difference between the Vcore output voltage value and the second separate VR phase output voltage value, determine a measured value i2b of the second current based on a sensed voltage from the current sense circuitry of the first Vcore phase while the second current is flowing, and determine offset and gain factors to correct measured value of current determined from the current sense circuitry based on a first relationship between the calculated first current value i1a and the measured first current value i2a and a second relationship between the calculated second current value i1b and the measured second current value i2b.

12. A voltage regulator VR system, comprising:

a first CPU core voltage Vcore phase and a separate VR phase;

current sense circuitry coupled in the output of the Vcore circuitry;

at least one processing device coupled to the current sense circuitry, the processing device being and coupled to control output voltage of each of the first Vcore phase and the separate VR phase and configured to:

control the output voltage of the first Vcore phase and the output voltage of the separate VR phase to cause a first current to flow between the first Vcore phase output and the separate VR phase output when an output of the first Vcore phase is electrically coupled to an output of the separate VR phase, control the output voltage of the first Vcore phase and the output voltage of the separate VR phase to cause a second current to flow between the first Vcore phase output and the separate VR phase output, when the output of the first Vcore phase is electrically coupled to the output of the separate VR phase the second current being different than the first current; and calibrate the current sense circuitry of the VR based on a relationship between values of the first and second currents as determined by the processing device based on measurements received from the current sense circuitry of the VR compared to values of the first and second currents as calculated based on a difference between the first Vcore phase output voltage and the separate VR phase output voltage while each of the first and second currents are flowing between the first Vcore phase output and the separate VR phase output.

13. The VR system of claim 12, where the current sense circuitry comprises inductor direct-current resistance DCR current sense circuitry coupled in the output of the first Vcore phase; and where the at least one processing device is configured to:

determine the measured value of each of the first and second currents based on corresponding measurements of voltage across a capacitor of the DCR current sense circuitry while the respective first and second currents are flowing; and calculate a value of first current based at least in part on a difference between the output voltage of the first Vcore phase and the output voltage of the separate VR phase while the first current is flowing, and calculate a value of the second current based at least in part on a difference between the output voltage of the first Vcore phase and the output voltage of the separate VR phase while the second current is flowing.

14. The system of claim 12, where the at least one processing device is configured to:

calculate a value of the first current based on a resistance value of a resistive element coupled between the first Vcore phase output and the separate VR phase output and the difference between the output voltage of the first Vcore phase and the output voltage of the separate VR phase while the first current is flowing through the resistive element; and calculate the value of the second current based on the resistance value and the difference between the output voltage of the first Vcore phase and the output voltage of the separate VR phase while the second current is flowing.

15. The system of claim 14, where components of the VR system are assembled on a printed circuit board assembly PCBA and that is configured to be temporarily coupled to an external test system that includes the resistive element and a test system voltage source to allow a voltage input of the first Vcore phase and a voltage input of the separate VR phase to receive power from the test system voltage source while the external resistive element of the test system is coupled between the first Vcore phase output and the separate VR phase output; and where the at least one processing device of the VR system is configured to perform at least the following steps while the test system is temporarily coupled to the VR:

control the output voltage of the first Vcore phase and the output voltage of the separate VR phase to cause the first current to flow between the first Vcore phase output and the separate VR phase output through the external resistive element; and control the output voltage of the first Vcore phase and the output voltage of the separate VR phase to cause the second current to flow between the first Vcore phase output and the separate VR phase output through the resistive element;

where the VR system is further configured to be decoupled from the test system.

16. The system of claim 15, where the VR comprises a multi-phase VR having multiple individual Vcore phases that each includes a respective individual and separate current sense circuitry; and where the at least one processing device of the VR system is configured to sequentially perform at least the following steps individually for each Vcore phase while the test system is temporarily coupled to the VR:

control the output voltage of the Vcore phase and the output voltage of the separate VR phase to cause the first current to flow between the Vcore phase output and the separate VR phase output through the external resistive element;

control the output voltage of the Vcore phase and the output voltage of the separate VR phase to cause the second current to flow between the Vcore phase output and the separate VR phase output through the resistive element; and calibrate the individual and separate current sense circuitry of the Vcore phase based on a relationship between values of the first and second currents as determined by the processing device based on measurements received from the individual and separate current sense circuitry of the Vcore phase compared to values of the first and second currents as calculated based on a difference between the Vcore phase output voltage and the separate VR phase output voltage while each of the first and second currents are flowing between the Vcore phase output and the separate VR phase output.

17. The system of claim 12, where the VR comprises a multi-phase VR having multiple individual Vcore phases that each includes a respective individual and separate current sense circuitry; and where the at least one processing device of the VR system is configured to sequentially perform at least the following steps individually for each of the multiple Vcore phases:

control the output voltage of the Vcore phase and the output voltage of the separate VR phase to cause the first current to flow between the Vcore phase output and the separate VR phase output;

control the output voltage of the Vcore phase and the output voltage of the separate VR phase to cause the second current to flow between the Vcore phase output and the separate VR phase output; and calibrate the individual and separate current sense circuitry of the Vcore phase based on a relationship between values of the first and second currents as determined by the processing device based on measurements received from the individual and separate current sense circuitry of the Vcore phase compared to values of the first and second currents as calculated based on a difference between the Vcore phase output voltage and the separate VR phase output voltage while each of the first and second currents are flowing between the Vcore phase output and the separate VR phase output.

18. The system of claim 12, where the at least one processing device of the VR system is configured to:

control the output voltage of the Vcore phase to be greater than the output voltage of the separate VR phase to cause the first current to flow from the Vcore phase output to the separate VR phase output;

control the output voltage of the Vcore phase to be greater than the output voltage of the separate VR phase to cause the second current to flow from the Vcore phase output to the separate VR phase output; and calibrate the individual and separate current sense circuitry of the Vcore phase based on a relationship between values of the first and second currents as determined by the processing device based on measurements received from the individual and separate current sense circuitry of the Vcore phase compared to values of the first and second currents as calculated based on a difference between the Vcore phase output voltage and the separate VR phase output voltage while each of the first and second currents are flowing between the Vcore phase output and the separate VR phase output.

19. The system of claim 12, where the at least one processing device of the VR is configured to:

set an output voltage of the first Vcore phase output to a first Vcore output voltage value and to set an output voltage of the separate VR phase output to a separate VR phase output voltage value that is different than the first Vcore output voltage value so as to cause a first current to flow between the Vcore output and the separate VR phase output through a resistive element having a resistance value that is coupled between the first Vcore phase output and the separate VR phase output;

determine a calculated value i1a of the first current based on a resistance value of the resistive element and the difference between the first Vcore output voltage value and the separate VR phase output voltage value;

determine a measured value i2a of the first current based on a sensed voltage from the current sense circuitry of the first Vcore phase while the first current is flowing;

set an output voltage of the first Vcore phase output to a second Vcore output voltage value that is different Thant the first Vcore output voltage value and to set an output voltage of the separate VR phase output to a voltage value that is different than the second Vcore output voltage value to cause a second current to flow between the Vcore output and the separate VR phase output through the resistive element;

determine a calculated value i1b of the second current based on a resistance value of the resistive element and the difference between the second Vcore output voltage value and the output voltage value;

determine a measured value i2b of the second current based on a sensed voltage from the current sense circuitry of the first Vcore phase while the second current is flowing; and determine offset and gain factors to correct measured value of current determined from the current sense circuitry based on a first relationship between the calculated first current value i1a and the measured first current value i2a and a second relationship between the calculated second current value i1b and the measured second current value i2b.

20. The system of claim 12, where the at least one processing device of the VR is configured to:

set an output voltage of the second phase output to a first output voltage value and to set an output voltage of the Vcore phase output to a Vcore output voltage value that is different than the first output voltage value so as to cause a first current to flow between the Vcore output and the output through a resistive element having a resistance value that is coupled between the first Vcore phase output and the second phase output;

determine a calculated value $i1a$ of the first current based on a resistance value of the resistive element and the difference between the Vcore output voltage value and the first separate VR phase output voltage value, determine a measured value $i2a$ of the first current based on a sensed voltage from the current sense circuitry of the first Vcore phase while the first current is flowing;

set an output voltage of the first second phase output to a second output voltage value that is different than the first output voltage value and to set an output voltage of the Vcore phase output to a voltage value that is different than the second output voltage value to cause a second current to flow between the Vcore output and the separate VR phase output through the resistive element;

determine a calculated value $i1b$ of the second current based on a resistance value of the resistive element and the difference between the Vcore output voltage value and the second separate VR phase output voltage value;

determine a measured value $i2b$ of the second current based on a sensed voltage from the current sense circuitry of the first Vcore phase while the second current is flowing; and determine offset and gain factors to correct measured value of current determined from the current sense circuitry based on a first relationship between the calculated first current value $i1a$ and the measured first current value $i2a$ and a second relationship between the calculated second current value $i1b$ and the measured second current value $i2b$.

\* \* \* \* \*